(12) United States Patent
Lin

(10) Patent No.: US 12,707,589 B2
(45) Date of Patent: Aug. 11, 2026

(54) FIXING MECHANISM AND SERVER HAVING THE SAME

(71) Applicant: Fulian Precision Electronics (Tianjin) Co., LTD., Tianjin (CN)

(72) Inventor: Jia-Feng Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 198 days.

(21) Appl. No.: 18/766,703

(22) Filed: Jul. 9, 2024

(65) Prior Publication Data

US 2025/0024627 A1 Jan. 16, 2025

(30) Foreign Application Priority Data

Jul. 14, 2023 (CN) ......................... 202310872644.9

(51) Int. Cl.
*H05K 7/14* (2006.01)
*G06F 1/185* (2026.01)

(52) U.S. Cl.
CPC ........... *H05K 7/1489* (2013.01); *G06F 1/185* (2013.01); *H05K 7/1401* (2013.01); *H05K 7/1427* (2013.01); *H05K 7/1461* (2013.01); *H05K 7/1485* (2013.01); *H05K 7/1487* (2013.01)

(58) Field of Classification Search
CPC .. H05K 7/1489; H05K 7/1401; H05K 7/1427; H05K 7/1461; H05K 7/1485; H05K 7/1487; H05K 5/0217; H05K 5/0221; H05K 7/1411; H05K 7/1418; G06F 1/185; G06F 1/184; G06F 1/183; G06F 1/186
See application file for complete search history.

(56) References Cited

U.S. PATENT DOCUMENTS

| | | | | |
|---|---|---|---|---|
| 5,657,204 A * | 8/1997 | Hunt | H05K 7/1409 | 361/752 |
| 5,868,585 A * | 2/1999 | Barthel | G06F 1/185 | 439/377 |
| 7,265,996 B2 * | 9/2007 | Fan | H05K 7/1408 | 361/740 |
| 7,364,447 B1 * | 4/2008 | Desrosiers | G06F 1/186 | 439/372 |
| 8,797,764 B2 * | 8/2014 | Bohannon | H05K 7/1489 | 361/810 |
| 10,064,299 B2 * | 8/2018 | Chen | H05K 7/1401 | |
| 10,863,644 B1 * | 12/2020 | Tseng | H05K 7/1487 | |
| 10,863,647 B1 * | 12/2020 | Escamilla | H05K 5/023 | |
| 11,197,387 B2 * | 12/2021 | Liu | G11B 33/128 | |

(Continued)

FOREIGN PATENT DOCUMENTS

| | | |
|---|---|---|
| CN | 114390814 A | 4/2022 |
| TW | M616072 U | 8/2021 |

*Primary Examiner* — Rockshana D Chowdhury
*Assistant Examiner* — Martin Antonio Asmat-Uceda
(74) *Attorney, Agent, or Firm* — ScienBiziP, P.C.

(57) ABSTRACT

A fixing mechanism and a server, including a housing and a sliding member. The housing is used for accommodating an expansion card. The fixing member is slidably arranged on the housing and is used to form a limiting fit with a first limiting portion on the expansion card to lock the expansion card in the housing. The sliding member is slidably arranged on the housing, the sliding member can slide along the first direction and the reverse direction of the first direction, the first direction is the direction in which the expansion card enters the housing.

18 Claims, 9 Drawing Sheets

(56) References Cited

U.S. PATENT DOCUMENTS 11,297,729 B2 * 4/2022 Potter .................... A47B 88/48
11,703,919 B1 * 7/2023 Zhong .................. H05K 7/1487 361/759
11,991,852 B2 * 5/2024 Shih ..................... H05K 7/1487
12,150,269 B2 * 11/2024 Zhong .................. H05K 7/1401
12,200,893 B2 * 1/2025 Huang ................. H05K 5/0221
12,289,856 B2 * 4/2025 Lin ......................... G06F 1/186
12,520,442 B2 * 1/2026 Lu ........................ H05K 5/0295
2002/0081890 A1 * 6/2002 Obermaier ........... H05K 7/1461 439/377
2006/0087801 A1 * 4/2006 Champion .............. G06F 1/185 361/679.41
2008/0094810 A1 * 4/2008 Lajara ..................... G06F 1/185 361/759
2011/0249385 A1 * 10/2011 Zhang ..................... G06F 1/185 361/679.4
2012/0099284 A1 * 4/2012 Boetzer ............ H01R 13/62905 361/756
2014/0106595 A1 * 4/2014 Zhu ......................... G06F 1/186 439/345
2014/0254086 A1 * 9/2014 Li ........................ H05K 7/1489 439/64
2014/0321083 A1 * 10/2014 Liu ......................... G06F 1/185 361/754
2015/0131227 A1 * 5/2015 Howell ................... G06F 1/185 211/26
2016/0224073 A1 * 8/2016 Chen .................... H05K 5/0221
2018/0232019 A1 * 8/2018 Tsai ..................... H05K 7/1422
2020/0146185 A1 * 5/2020 Wu .................... H05K 7/20172
2021/0385958 A1 * 12/2021 Yu ........................ H05K 7/1418
2022/0007534 A1 * 1/2022 Wang ................... H05K 7/1487
2023/0062355 A1 * 3/2023 Zhang ..................... G06F 1/185
2023/0315169 A1 * 10/2023 Zhou .................... H05K 7/1407 361/679.32
2023/0344159 A1 * 10/2023 Hsu ...................... H01R 12/737

* cited by examiner

FIXING MECHANISM AND SERVER HAVING THE SAME

FIELD

The subject matter herein generally relates to computer technology, and more particularly, to a fixing mechanism and a server having the fixing mechanism.

BACKGROUND

Expansion cards need to be installed in servers to expand the memory of electronic devices. To fix the expansion card securely in the server, related methods include putting the expansion card in a slot first and then fastening the expansion card with screws. To replace the expansion card, tools must be used to remove the screws before the expansion card can be taken out of the slot, which may be inconvenience for the user.

BRIEF DESCRIPTION OF THE DRAWINGS

Implementations of the present technology will now be described, by way of example only, with reference to the attached FIGS.

DETAILED DESCRIPTION

Figure 1:
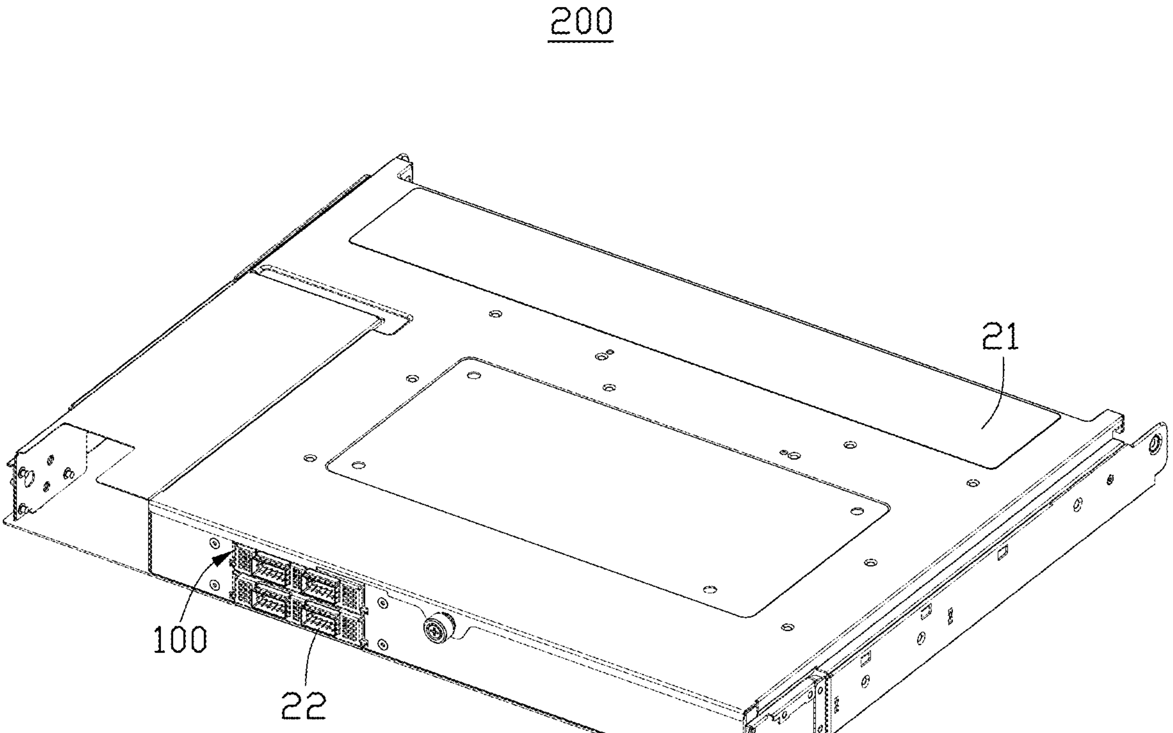
FIG. 1 is a diagrammatic view of a server according to an embodiment of the present disclosure.

It will be appreciated that for simplicity and clarity of illustration, where appropriate, reference numerals have been repeated among the different FIGS. to indicate corresponding or analogous members. In addition, numerous specific details are set forth in order to provide a thorough understanding of the embodiments described herein. However, it will be understood by those of ordinary skill in the art that the embodiments described herein can be practiced without these specific details. In other instances, methods, procedures, and members have not been described in detail so as not to obscure the related relevant feature being described. Also, the description is not to be considered as limiting the scope of the embodiments described herein. The drawings are not necessarily to scale and the proportions of certain portion may be exaggerated to better illustrate details and features of the present disclosure.

Figure 2:
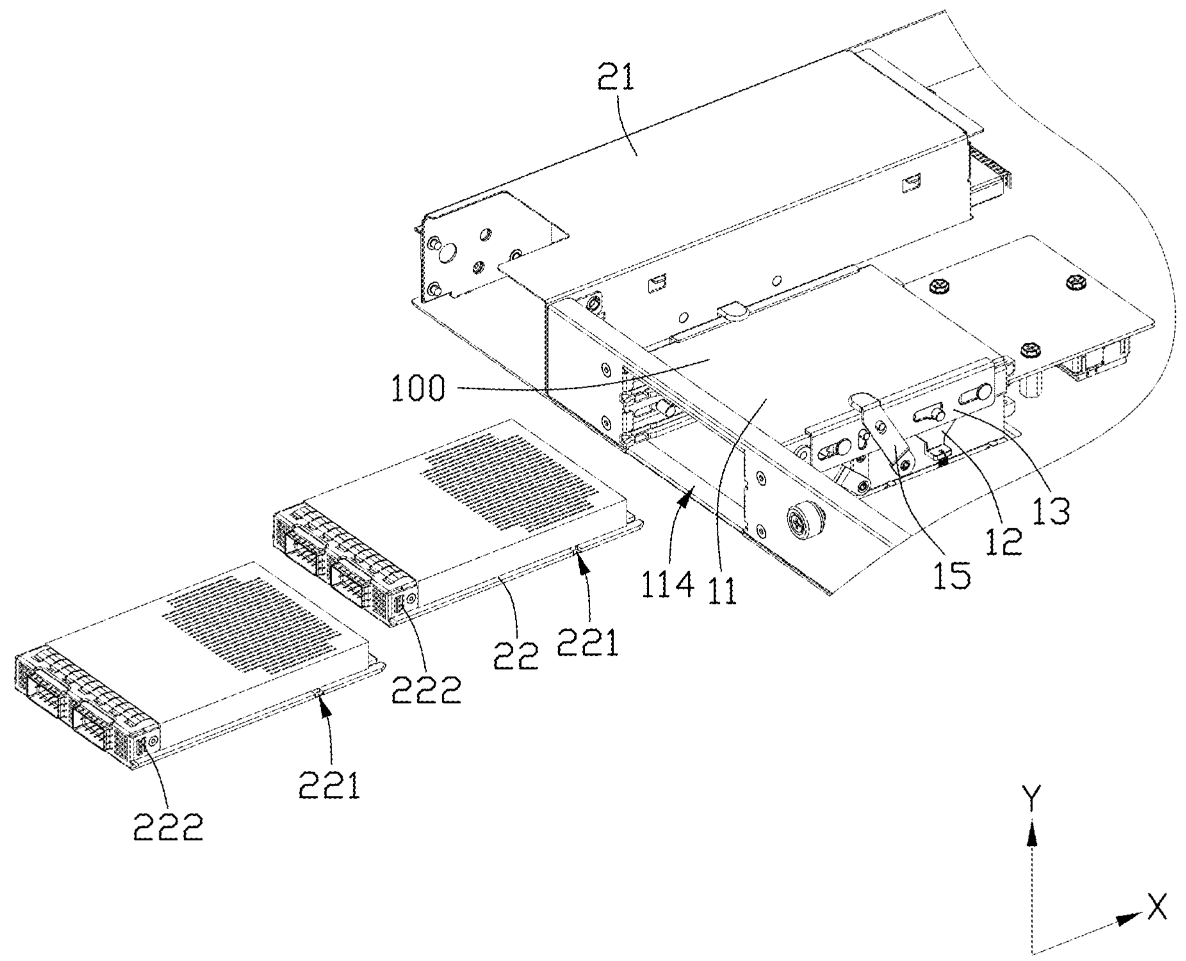
FIG. 2 is a partial diagrammatic view showing a fixing mechanism and an expansion card according to an embodiment of the present disclosure.

Referring to FIGS. 1 and 2, a server 200 is provided according to an embodiment of the present application. The server 200 includes a casing 21 and a fixing mechanism 100. The fixing mechanism 100 is arranged on the casing 21. The fixing mechanism 100 is configured to lock or unlock an expansion card 22.

In this embodiment, the expansion card 22 is provided with a first limiting portion 221. The first limiting portion 221 is configured to form a limiting fit with the fixing mechanism 100. For example, the first limiting portion 221 is provided on an edge of the expansion card 22. When the expansion card 22 is inserted into the fixing mechanism 100, the first limiting portion 221 may form a limiting fit with the fixing mechanism 100, thereby locking the expansion card 22.

Figure 3:
FIG. 3 is a diagrammatic view of an overall structure of a fixing mechanism according to an embodiment of the present disclosure.
Figure 3:
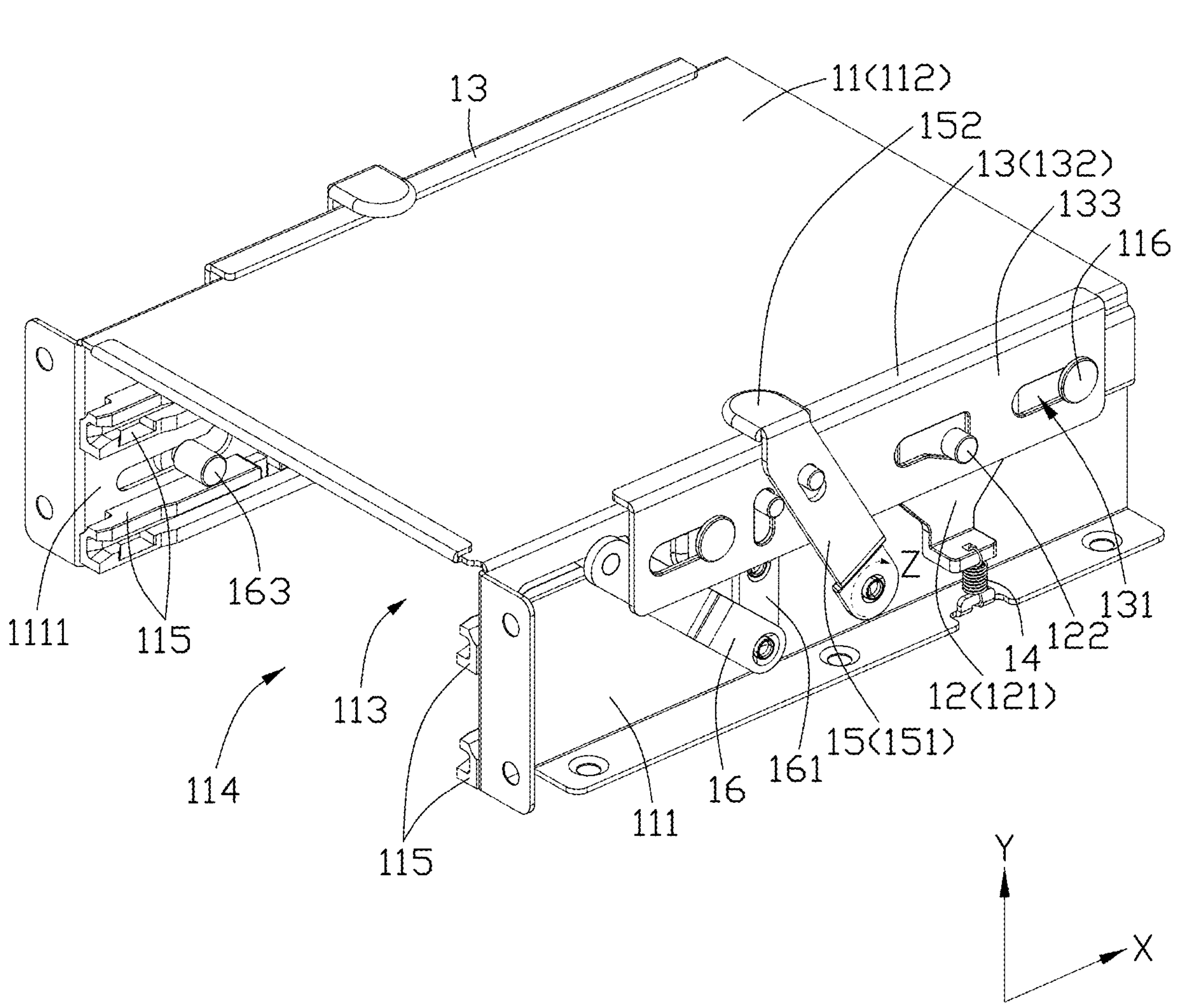

Referring to FIGS. 2 and 3, a fixing mechanism 100 is provided according to an embodiment of the present application. The fixing mechanism 100 is applied to the server 200. The fixing mechanism 100 includes a housing 11, a fixing member 12, and a sliding member 13. The housing 11 is configured to accommodate the expansion card 22. The fixing member 12 is slidably arranged on the housing 11 and may be connected to the expansion card 22. The sliding member 13 is slidably arranged on the housing 11 and may drive the fixing member 12 to slide relative to the housing 11.

In this embodiment, the sliding member 13 may slide along a first direction X and an opposite direction relative to the first direction X. The expansion card enters the housing 11 along the first direction X. The fixing member 12 may slide in a direction perpendicular to the first direction X.

By driving the sliding member 13 to slide, the fixing member 12 is caused to slide relative to the housing 11 so that the fixing member 12 can form a limiting fit with the first limiting portion 221 of the expansion card 22, thereby securing the expansion card 22 in the housing 11 of the fixing mechanism 100. The process of fixing the expansion card 22 in the housing 11 does not require any tools, thereby enhancing the convenience of installing the expansion card 22.

Referring to FIGS. 2 and 3, in this embodiment, the housing 11 includes two first outer walls 111 and a second outer wall 112. The two first outer walls 111 are connected by the second outer wall 112 and are arranged opposite to each other. The two first outer walls 111 and the second outer wall 112 enclose a receiving cavity 113, which has an opening 114. The receiving cavity 113 is configured to accommodate the expansion card 22. The expansion card 22 can enter the receiving cavity 113 through the opening 114 along the first direction X or be taken out from the receiving cavity 113 along the opposite direction of the first direction X. In this embodiment, the two first outer walls 111 are respectively perpendicular to the second outer wall 112.

In this embodiment, each first outer wall 111 has two opposite inner wall surfaces 1111, each of which is provided with a track member 115. The track member 115 extends along the first direction X and is used for the sliding installation of the expansion card 22.

For example, the track member 115 is provided with a sliding slot for accommodating the expansion card 22. The track member 115 is fixed to the inner wall surface 1111. The sliding slot can also be directly formed on the inner wall surface 1111, such as by punching out a bent piece on the first outer wall 111 towards the inside of the housing 11.

When the expansion card 22 enters the receiving cavity 113, two opposite edges of the expansion card 22 can gradually enter the receiving cavity 113 along the corresponding track members 115. The sliding slot not only guides the insertion and removal of the expansion card 22 but also supports and limits the expansion card 22, so that the expansion card 22 is less likely to shake within the housing.

Figure 4:
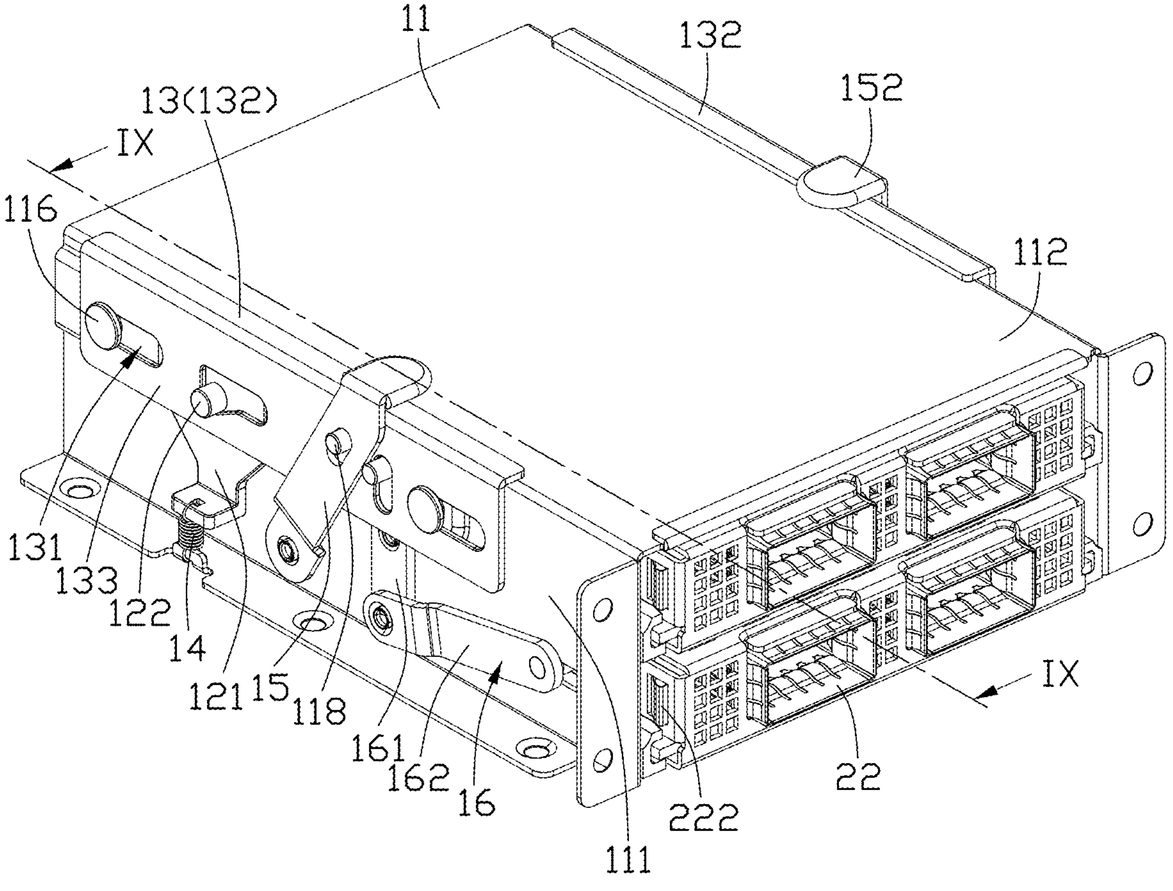
FIG. 4 is a structural diagrammatic view showing an expansion card installed in a housing according to an embodiment of the present disclosure.
Figure 5:
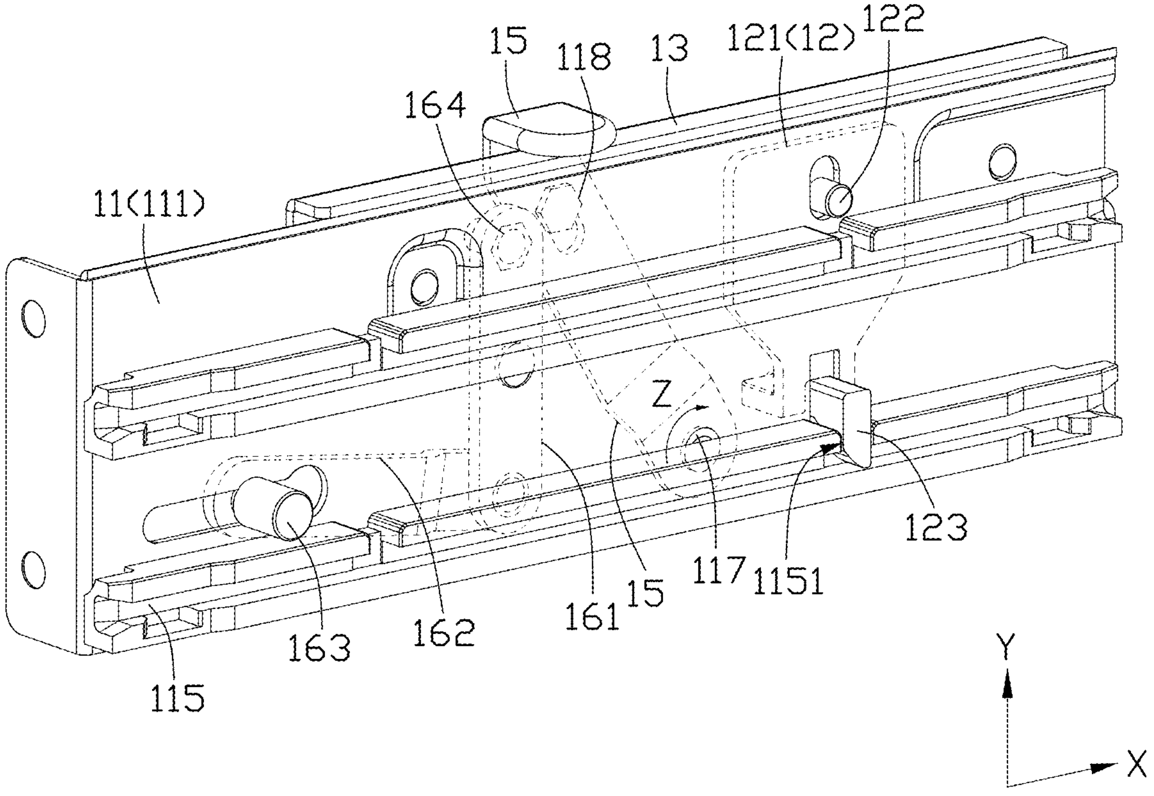
FIG. 5 is an internal structural diagrammatic view showing a fixing mechanism in a locked state of an expansion card according to an embodiment of the present disclosure.

Referring to FIGS. 4 and 5, FIG. 5 shows the internal structure of the housing 11 when the expansion card 22 is not placed inside the housing 11. A portion of FIG. 5 that is obscured by the housing 11 is shown using dashed lines. In this embodiment, the track member 115 has a clearance hole 1151. When the first limiting portion 221 of the expansion card 22 slides to the clearance hole 1151, the fixing member 12 is able to slide from the clearance hole 1151 to snap fit with the first limiting portion 221 of the expansion card 22.

Referring to FIGS. 3 and 5, in this embodiment, each inner wall surface 1111 is provided with at least two track members 115 distributed along the second direction Y and being parallel to each other. The second direction Y is perpendicular to the first direction X. This arrangement facilitates the housing 11 to accommodate multiple expansion cards 22.

Figure 6:
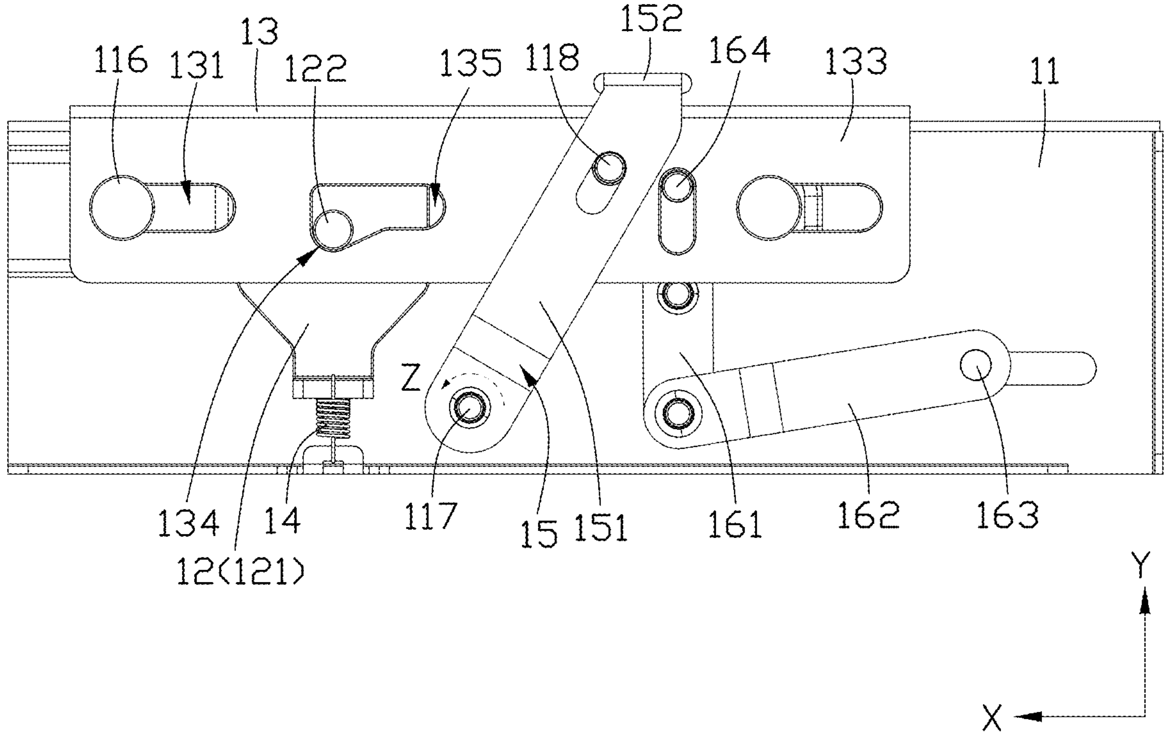
FIG. 6 is an external structural diagrammatic view showing a fixing mechanism in a locked state of an expansion card according to an embodiment of the present disclosure.

Referring to FIGS. 5 and 6, in this embodiment, the housing 11 includes a first connecting portion 116. The sliding member 13 has a second connecting portion 131. The first connecting portion 116 is movably connected to the second connecting portion 131, the second connecting portion 131 can slide along the first direction X or the opposite direction of the first direction X relative to the first connecting portion 116.

The first connecting portion 116 may slide relative to the second connecting portion 131 to mount the sliding member 13 on the housing 11. The first connecting portion 116 and the second connecting portion 131 can provide a guiding and supporting effect for the sliding of the sliding member 13 to improve the stability of the movement of the sliding member 13.

For example, in this embodiment, the second connecting portion 131 is an elongated hole, a length direction of the elongated hole is parallel to the first direction X. The first connecting portion 116 is a bolt, and the bolt is fixed to the outer surface of the housing 11. The bolt is threaded in the elongated hole and is capable of sliding along the length direction of the elongated hole. The bolt can also be replaced with a component such as screws, pins, or other parts which are capable of cooperating with the elongated hole and achieving the sliding movement of the sliding member 13. Alternatively, the first connecting portion 116 can also be an elongated hole and the second connecting portion 131 can be a bolt.

For example, in another embodiment, the first connecting portion 116 is a guide slot (not shown in the figure), and the second connecting portion 131 is a guide post (not shown in the figure). The length direction of the guide slot is parallel to the first direction X, and the guide post is slidably arranged in the guide slot. The sliding of the guide post in the guide slot enables the sliding member 13 to slide relative to the housing 11. Alternatively, the first connecting portion 116 can be a guide post, and the second connecting portion 131 can be a guide slot.

Referring to FIGS. 5 and 6, in this embodiment, the first connection portion 116 is provided in a plurality, the second connection portion 131 is provided in a plurality, and the plurality of first connecting portions 116 correspond to the plurality of second connecting portions 131 one-to-one. For example, the first connection portion 116 and the second connection portion 131 are each provided with two.

Referring to FIGS. 3 and 4, in this embodiment, the sliding member 13 includes a first wall 132 and a second wall 133. The first wall 132 and the second wall 133 are perpendicularly connected to each other. The first wall 132 is arranged on the second outer wall 112 and is substantially parallel to the second outer wall 112. The second wall 133 is substantially parallel to one of the first outer walls 111 of the housing 11. "Substantially parallel" means including a situation in which the first wall 132 or the second wall 133 is perfectly parallel to the second outer wall 112 and a situation in which the angle between the first wall 132 or the second wall 133 and the second outer wall 112 is within ±5 degrees.

In this embodiment, the second connecting portion 131 is arranged on the second wall 133, and the first connecting portion 116 is arranged on one of the first outer walls 111 of the housing 11. Alternatively, the second connecting portion 131 is arranged on the first wall 132, the first connecting portion 116 is arranged on the second outer wall 112 of the housing 11.

Figure 7:
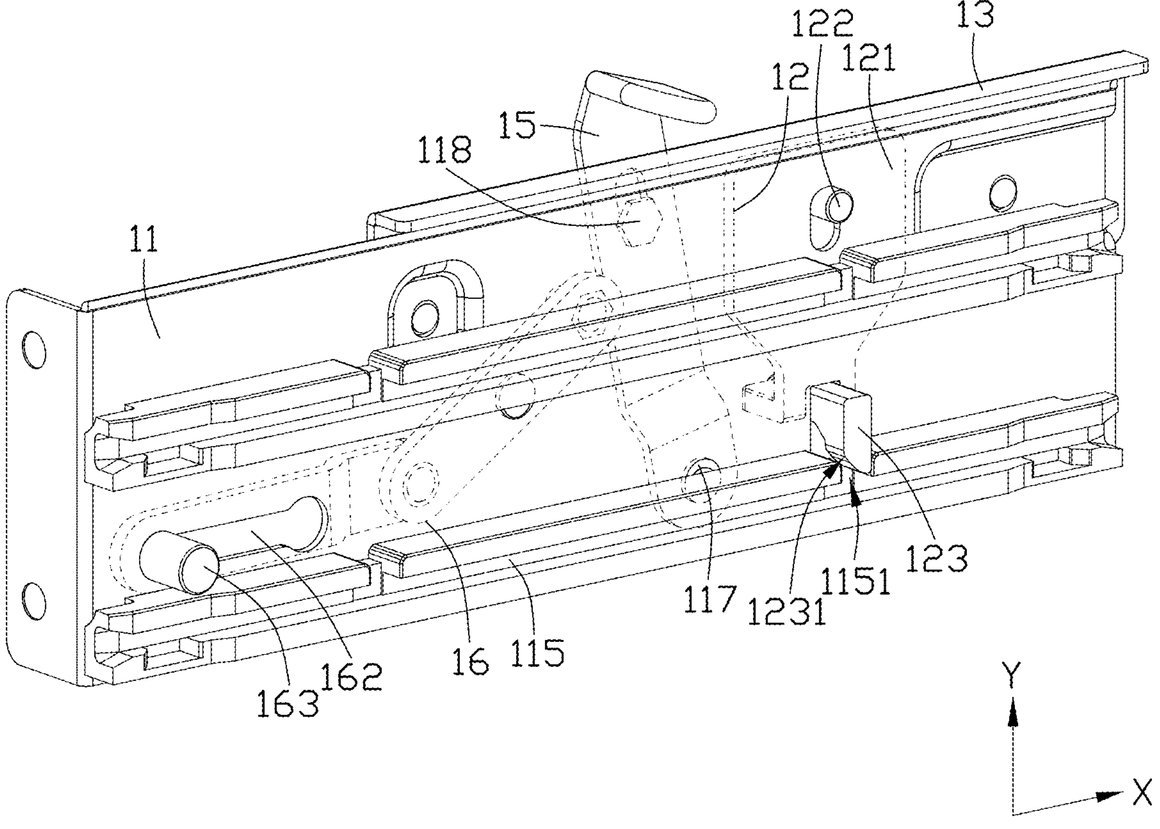
FIG. 7 is an internal structural diagrammatic view showing a fixing mechanism in an unlocked state of an expansion card according to an embodiment of the present disclosure.
Figure 8:
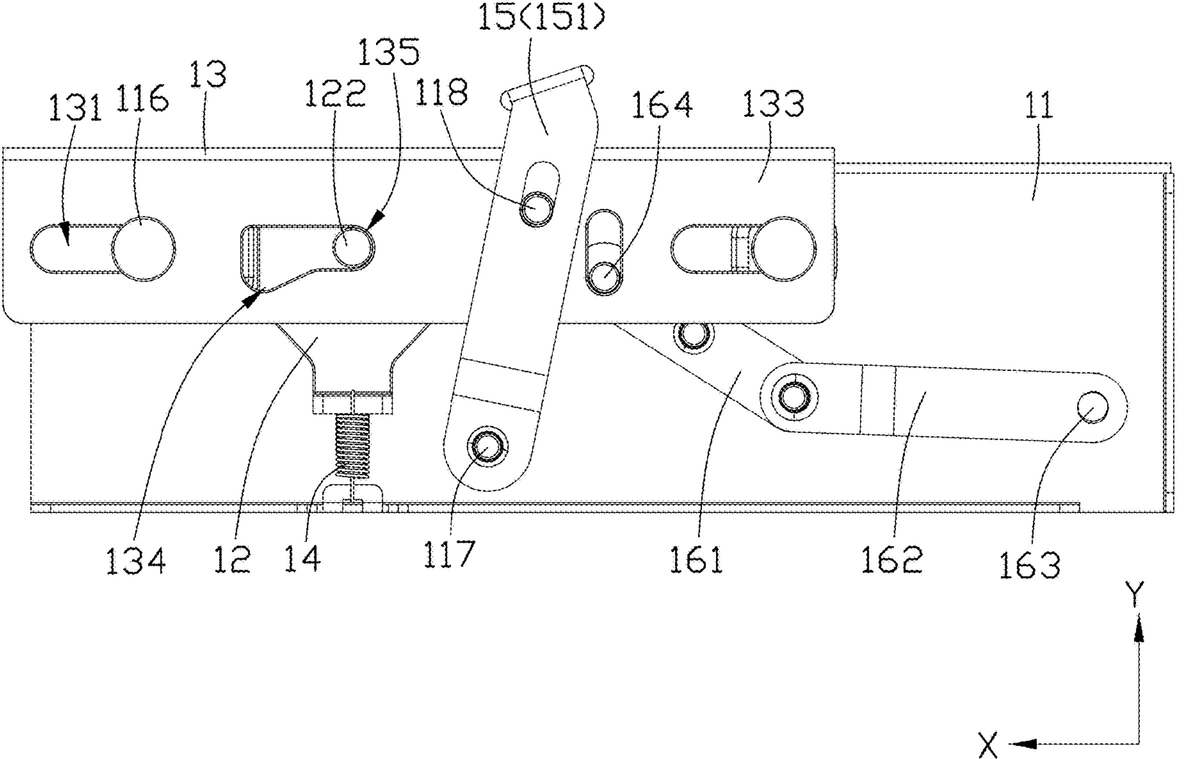
FIG. 8 is an external structural diagrammatic view showing a fixing mechanism in an unlocked state of an expansion card according to an embodiment of the present disclosure.

Referring to FIGS. 4, 5, and 6, in this embodiment, the sliding member 13 is provided with a first supporting portion 134 and a second supporting portion 135 that communicate with each other, so as to lock the expansion card 22 in the housing 11 or unlock the expansion card 22 from the housing 11. When the fixing member 12 is connected to the first supporting portion 134, the fixing member 12 forms a limiting fit with the first limiting portion 221 of the expansion card 22. Referring to FIGS. 7 and 8, when the fixing member 12 is connected to the second supporting portion 135, the fixing member 12 is disengaged from the first limiting portion 221, and the fixing mechanism 100 unlocks the expansion card 22. The sliding member 13 can switch the fixing member 12 between a locked state and an unlocked state by sliding itself.

There is an inclined surface between the first supporting portion 134 and the second supporting portion 135. When the fixing member 12 slides from the first supporting portion 134 to the second supporting portion 135, the fixing member 12 can slide along the inclined surface in the second direction Y, causing the fixing member 12 to lift during the sliding process, thereby switching the fixing member 12 from the state of locking the expansion card 22 in the housing 11 to the state of unlocking the expansion card 22 from the housing 11.

By driving the sliding member 13 to slide, the relative position between the fixing member 12 and the sliding member 13 is changed, allowing the fixing member 12 to connect with the first supporting portion 134 or the second supporting portion 135, so that the fixing member 12 is able to lock the expansion card 22 in the housing 11 or so that the fixing member 12 is disengaged from the first limiting portion 221, thus the fixing mechanism 100 is able to unlock the expansion card 22 and the expansion card 22 can be removed from the housing 11.

Referring to FIGS. 5, 6, 7, and 8, FIGS. 5 and 6 show the state when the fixing member 12 is connected to the first supporting portion 134, and FIGS. 7 and 8 show the state when the fixing member 12 is connected to the second supporting portion 135. FIGS. 5 and 7 show the internal structure of the housing 11 when the expansion card 22 is not placed inside the housing. The portion of FIGS. 5 and 7 that is obscured by the housing 11 is shown using dashed lines.

In this embodiment, the first supporting portion 134 and the second supporting portion 135 are two through holes communicating with each other on the sliding member 13. The first supporting portion 134 is the first through hole, and the second supporting portion 135 is the second through hole. The first through hole and the second through hole are arranged on the second wall 133. The maximum distance between the inner wall of the first through hole and the second outer wall 112 of the housing 11 is greater than the maximum distance between an inner wall of the second through hole and the second outer wall 112 of the housing 11. By sliding the sliding member 13, the fixing member 12 can slide in the first through hole and the second through hole. When the fixing member 12 is connected to the first through hole, the fixing member 12 is in the state of locking the expansion card 22; when the fixing member 12 is connected to the second through hole, the fixing member 12 is in the state of unlocking the expansion card 22.

Referring to FIGS. 5, 6, 7, and 8, in this embodiment, the minimum distance between the first supporting portion 134 and the second outer wall 112 is equal to the minimum distance between the second supporting portion 135 and the second outer wall 112. That is, the minimum distance between the inner wall of the first through hole and the second outer wall 112 is equal to the minimum distance between the inner wall of the second through hole and the second outer wall 112. When the mounting portion 122 of the fixing member 12 slides to contact the inner wall of the second through hole close to the second outer wall 112, the mounting portion 122 of the fixing member 12 can also be separated from the first limiting portion 221. That is, when the fixing member 12 is connected to the first supporting portion 134, the fixing member 12 can also unlock the expansion card 22. When the expansion card 22 is not placed inside the housing 11, the mounting portion 122 of the fixing member 12 is connected to the first through hole at a position far from the second outer wall 112. Before the expansion card 22 is inserted into the housing 11, the fixing member 12 can be slid along the second direction Y so that the mounting portion 122 is connected to the first through hole at a position close to the second outer wall 112. At this time, the expansion card 22 can be inserted into the housing 11. After the expansion card 22 is inserted into the housing 11, the fixing member 12 can be slid in the opposite direction of the second direction Y to the position of the first through hole far from the second outer wall 112, thereby locking the expansion card 22 in the housing 11.

This arrangement makes it unnecessary to drive the sliding member 13 to slide, and the unlocking of the fixed member 12 can be realized by directly sliding the fixing member 12 so that the fixed member 12 is connected to the position of the first through hole near the second outer wall 112. Alternatively, it is also possible to slide the fixed member 12 to connect with the second support portion 135 by sliding the sliding member 13 to realize the unlocking of the fixed member 12 to the expansion card 22.

In another embodiment, the first supporting portion 134 and the second supporting portion 135 can also be sliding rails (not shown in the figure), and the fixing member 12 can slide along the sliding rails to switch between the state of locking the expansion card 22 and the state of unlocking the expansion card 22.

Figure 9:
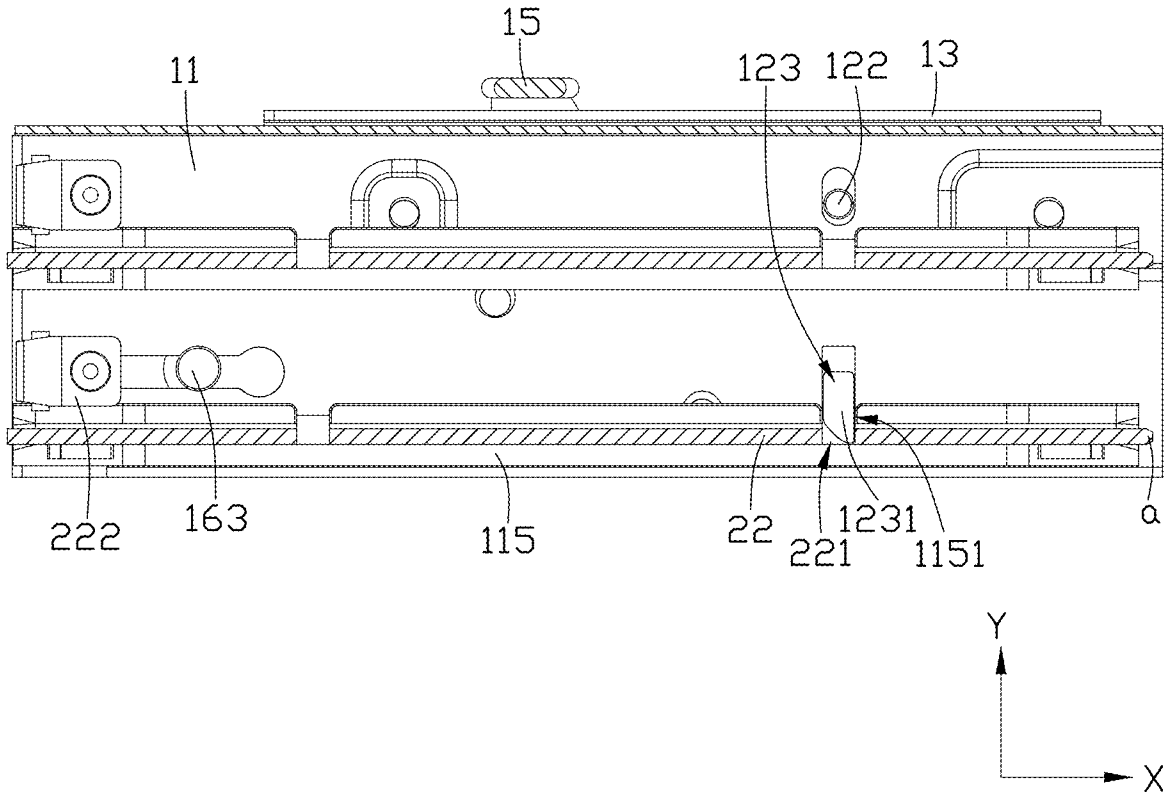
FIG. 9 is a cross-sectional view showing an expansion card installed in a fixing mechanism according to an embodiment of the present disclosure.

Referring to FIGS. 7, 8, and 9, FIG. 9 is a sectional view of the fixing mechanism when the expansion card is placed inside the housing, and FIG. 9 is a sectional view along the IX-IX direction in the state of FIG. 4. In this embodiment, the fixing member 12 includes a body 121, an mounting portion 122, and a second limiting portion 123. The mounting portion 122 and the second limiting portion 123 are fixed on the body 121. The mounting portion 122 is slidably arranged on the housing 11, and the second limiting portion 123 is configured to form a limiting fit with the first limiting portion 221 on the expansion card 22 to lock the expansion card 22. The mounting portion 122 is connected to the first supporting portion 134 or the second supporting portion 135, to enable the second limiting portion 123 forms a limiting fit or release a limiting fit with the first limiting portion 221. The body 121 is disposed on the exterior of the housing 11, and the second limiting portion 123 penetrates the housing 11 and enters into the housing 11.

In this embodiment, the mounting portion 122 is provided cylindrical shape and one end of the mounting portion 122 is located outside of the housing 11 and the other end of the mounting portion 122 penetrates the housing 11 and is movably connected to the housing 11. One end of the mounting portion 122 outside the housing 11 can be connected to the first supporting portion 134 or the second supporting portion 135, so that the second limiting portion 123 forms a limit or releases the limit with the first limiting portion 221. In other embodiments, the mounting portion 122 can also be a slider, which can move along a sliding rail. The end of the mounting portion 122 disposed outside of the housing 11 can be coupled to the first support portion 134 or the second support portion 135 to enable the second limiting portion 123 to form a limit or release a limit with the first limiting portion 221. In other embodiments, the mounting portion 122 may also be a slider, the slider being capable of moving along a slide.

Referring to FIGS. 2, 7, 8, and 9, in this embodiment, the second limiting portion 123 is a snap hook, and the first limiting portion 221 is a limiting notch. The snap hook can enter or move away from the limiting notch, so that the fixing member 12 is in a locked state or unlocked state. In other embodiments, the first limiting portion 221 and the second limiting portion 123 can be magnetic components (not shown in the figure). When the first limiting portion 221 and the second limiting portion 123 are close to each other, the first limiting portion 221 and the second limiting portion 123 attract each other to form a lock state. When the first limiting portion 221 and the second limiting portion 123 are far away from each other, the lock state is released to form a unlock state.

Referring to FIG. 9, in this embodiment, the second limiting portion 123 has a guiding block 1231. The guiding block 1231 gradually narrows or tapers in the opposite direction of the second direction Y. The guiding block 1231 has an inclined surface that first contacts a side of the expansion card 22. The second direction Y is the sliding direction of the fixing member 12 when unlocking the expansion card 22.

During the process of the expansion card 22 entering the housing 11, one end of the expansion card 22 first entering the housing 11 may first contact the inclined surface of the guiding block 1231, causing the guiding block 1231 of the second limiting portion 123 to be pushed by the expansion card 22, thereby making the second limiting portion 123 slide in the second direction Y. This prevents the first limiting portion 221 from blocking the entry of the expansion card 22 into the housing 11. As shown in FIG. 9, the end a of the expansion card 22 first contacts the inclined surface of the guiding block 1231. When the first limiting portion 221 of the expansion card 22 slides to the corresponding position of the second limiting portion 123, the inclined surface of the second limiting portion 123 is no longer pushed by the expansion card 22, and the first limiting portion 221 and the second limiting portion 123 form a limiting fit. This arrangement allows the expansion card 22 to be directly inserted into the housing 11 along the first direction X without any operation on the fixing mechanism 100.

Referring to FIGS. 3 and 4, in this embodiment, the fixing mechanism 100 further includes an elastic reset member 14. The elastic reset member 14 is connected to the housing 11 and the fixing member 12. When a portion of the fixing member 12 is connected to the second supporting portion 135, the elastic reset member 14 is stretched to have elastic force, thereby the stretched elastic reset member 14 can drive the fixing member 12 to slide in a direction of forming a limit fit with the first limiting portion 221. The second direction Y is the sliding direction when the fixing member 12 unlocks the expansion card 22.

For example, in this embodiment, one end of the elastic reset member 14 is connected to a bottom of the housing 11, and the other end of the reset member 14 is connected to the bottom of the body 121. When the he mounting portion 122 of the fixing member 12 is connected to the second supporting portion 135, the elastic reset member 14 is stretched, and the elastic force generated by the elastic reset member 14 can pull the fixing member 12 in an opposite direction of the second direction Y, so that the fixing member 12 can automatically lock the expansion card 22 when not subjected to other external forces. Moreover, when the fixing member 12 forms a limiting fit with the first limiting portion 221, that is, when the mounting portion 122 of the fixing member 12 is connected to the first supporting portion 134, the elastic force of the elastic reset member 14 makes the fixing member 12 tend to slide in a direction of forming a limiting fit with the first limiting portion 221, thereby improving the tightness of the fit between the fixing member 12 and the first limiting portion 221.

In this embodiment, the elastic reset member 14 is a spring. In other embodiments, the elastic reset member 14 can also be other structures capable of elastic deformation, like rubber bands or elastic plates.

In this embodiment, there are two sliding members 13, which are respectively slidably arranged on both sides of the housing 11. Each first outer wall 111 of the housing 11 is provided with one of the sliding member 13, and each sliding member 13 is at least provided with a fixing member 12. The fixing members 12 on the two sliding members 13 are used to fix different expansion cards 22. Multiple expansion cards 22 can be simultaneously accommodated in the housing 11, and each expansion card 22 is provided with a corresponding fixing member 12. The fixing members 12 on different sliding members 13 can simultaneously fix multiple expansion cards 22.

In this embodiment, two expansion cards 22 can be arranged along the second direction Y in a two-layer distribution. The fixing members 12 on each first outer wall 111 of the housing 11 can fix one of the expansion cards 22.

Referring to FIGS. 4, 5, and 6, in this embodiment, the fixing mechanism 100 further includes a rotating member 15. One end of the rotating member 15 is rotatably connected to the housing 11, and the other end of the rotating member 15 is rotatably connected to the sliding member 13. The rotating member 15 can drive the sliding member 13 to slide on the housing 11.

For example, the rotating member 15 includes a rotating part 151 and an operating part 152 connected to each other. One end of the rotating part 151 is rotatably connected to the housing 11, and the other end of the rotating part 151 is rotatably connected to the sliding member 13. Both ends of the rotating part 151 are respectively provided with through holes. The housing 11 is provided with a first rotating shaft 117, and the sliding member 13 is provided with a second rotating shaft 118. The second rotating shaft 118 passes through the sliding member 13. The rotating part 151 is rotatably connected to the housing 11 through the first rotating shaft 117. The operating part 152 is connected to one end of the rotating part 151. By toggling the operating part 152, the rotating part 151 can rotate relative to the first rotating shaft 117. Meantime, the operating part 152 pushes the second rotating shaft 118 during the rotation process and driving the sliding member 13 to slide on the housing 11.

By rotating the rotating member 15, the rotation of rotating member 15 is capable of driving the sliding member 13 to slide on the housing 11 along the first direction X or the opposite direction of the first direction X, thereby switching the fixing member 12 between the locked state and the unlocked state, so as to facilitate operation by the user. When the rotating member 15 rotates, the rotating member 15 can drive the sliding member 13 to slide, thereby causing the mounting portion 122 of the fixing member 12 to slide in the first supporting portion 134 and the second supporting portion 135, switching the fixing member 12 between the locked state and the unlocked state.

Referring to FIGS. 5, 6, 7, and 8, in this embodiment, the fixing mechanism 100 further includes a pushing assembly 16, which is movably connected to the sliding member 13 and the housing 11, respectively. When the sliding member 13 slides along the first direction X, the fixing member 12 can switch from being connected to the first supporting portion 134 to being connected to the second supporting portion 135. The sliding member 13 can drive the pushing assembly 16 to move, thereby pushing the expansion card 22 to move in the opposite direction of the first direction X. For example, when the sliding member 13 slides along the first direction X, the mounting portion 122 of the fixing member 12 can switch from being connected to the first supporting portion 134 to being connected to the second supporting portion 135.

When the sliding member 13 slides in a direction in which the fixing member 12 can be unlocked, that is, when the sliding member 13 slides along the first direction X, the fixing member 12 can be converted into a state in which the expansion card 22 is unlocked, that is, the expansion card 22 can be removed from the housing 11. Meantime, the sliding member 13 also drives the pushing assembly 16 to move, causing the pushing assembly 16 to push the expansion card 22 in the opposite direction of the first direction X, thereby allowing one end of the expansion card 22 to be exposed outside the housing 11, facilitating the complete removal of the expansion card 22 from the housing 11.

In this embodiment, the pushing assembly 16 includes a first connecting rod 161, a second connecting rod 162, and a pushing portion 163. One end of the first connecting rod 161 is hinged to one end of the second connecting rod 162, the other end of the first connecting rod 161 is rotatably connected to the sliding member 13 and can slide relative to the sliding member 13 along the second direction Y or the opposite direction of the second direction Y. The other end of the second connecting rod 162 is rotatably connected to the pushing portion 163. The pushing portion 163 is slidably arranged on the housing 11. The pushing portion 163 can slide along the first direction X or the opposite direction of the first direction X. The pushing portion 163 is configured to push the expansion card 22 to slide in the opposite direction of the first direction X. As shown in FIG. 2, the expansion card 22 is provided with a protrusion 222, which protrudes from the outer wall surface of the expansion card 22. When the fixing member 12 unlocks the expansion card 22, that is, when the fixing member 12 is disengaged from the first limiting portion 221, the pushing portion 163 pushes the protrusion 222 to push the expansion card 22 out of the housing 11, facilitating the removal of the expansion card 22 from the housing 11.

When the sliding member 13 slides along the first direction X, it causes one end of the first connecting rod 161 to slide relative to the sliding member 13 along the second direction Y or the opposite direction of the second direction Y. The first connecting rod 161 rotates relative to the sliding member 13, thereby causing the second connecting rod 162 to rotate relative to the first connecting rod 161 and driving the pushing portion 163 to slide in the opposite direction of the first direction X. This enables the pushing portion 163 to push the expansion card 22 out of the housing 11, facilitating the separation of the expansion card 22 from the housing 11.

Referring to FIGS. 5, 6, 7, and 8, in this embodiment, the sliding member 13 is provided with an elongated hole, the length direction of the elongated hole is parallel to the second direction Y. The first connecting rod 161 is connected to a third rotating shaft 164, which is arranged in the elongated hole. When the sliding member 13 slides, the third rotating shaft 164 can slide and rotate in the elongated hole, thereby driving the pushing assembly 16 to rotate relative to the housing 11. The first outer wall 111 of the housing 11 is also provided with an elongated hole, the length direction of which is parallel to the first direction X. The pushing portion 163 is arranged in the elongated hole of the first outer wall 111 of the housing 11 and can slide along the first direction X or the opposite direction of the first direction X in the elongated hole of the first outer wall 111 of the housing 11.

When the sliding member 13 slides along the first direction X, the third rotating shaft 164 slides in the opposite direction of the second direction Y in the corresponding elongated hole. The movement of the third rotating shaft 164 causes the first connecting rod 161 to rotate relative to the sliding member 13, thereby causing the second connecting rod 162 to rotate relative to the first connecting rod 161, and the second connecting rod 162 drives the pushing portion 163 to slide in the opposite direction of the first direction X, thereby pushing the expansion card 22 out of the housing 11.

When the expansion card 22 is removed from the housing 11, the operating part 152 is toggled, causing the rotating part 151 to rotate along the third direction Z, moving the sliding member 13 in the opposite direction of the first direction X. Meantime, the mounting portion 122 of the fixing member 12 slides from the first supporting portion 134 to the position of the second supporting portion 135 away from the second outer wall 112. That is, the fixing member 12 slides in the second direction Y, causing the second limiting portion 123 to move away from the first limiting portion 221, thereby releasing the limit on the expansion card 22. The sliding member 13 also drives the first connecting rod 161, which in turn drives the second connecting rod 162 and the pushing portion 163, causing the pushing portion 163 to move in the opposite direction of the first direction X, thereby pushing one end of the expansion card 22 out of the housing 11.

Before the expansion card 22 is inserted into the housing 11, the mounting portion 122 is located at a position of the first supporting portion 134 away from the second outer wall 112. During the insertion of the expansion card 22 into the housing 11, the end of the expansion card 22 first entering the housing 11 contacts the inclined surface of the guiding block 1231 of the second limiting portion 123, causing the guiding block 1231 of the second limiting portion 123 to be pushed by the end of the expansion card 22, thereby sliding the second limiting portion 123 in the second direction Y to the position of the first supporting portion 134 close to the second outer wall 112. This prevents the first limiting portion 221 from blocking the entry of the expansion card 22 into the housing 11. When the first limiting portion 221 of the expansion card 22 slides to the corresponding position of the second limiting portion 123, the inclined surface of the second limiting portion 123 is no longer pushed by the expansion card 22. The second limiting portion 123 slides in the opposite direction of the second direction Y under the force of the elastic reset member 14, moving back to the position of the first supporting portion 134 away from the second outer wall 112, thereby forming a limiting fit between the first limiting portion 221 and the second limiting portion 123.

In present disclosure, the fixing member 12 can switch between the state of locking the expansion card 22 and the state of unlocking the expansion card 22 by driving the sliding member 13 to move, without the need for other tools, thereby facilitating the installation of the expansion card 22 in the fixing mechanism 100 and improving the convenience of installing the expansion card 22 in the server 200.

Even though information and advantages of the present embodiments have been set forth in the foregoing description, together with details of the structures and functions of the present embodiments, the disclosure is illustrative only. Changes may be made in detail, especially in matters of shape, size, and arrangement of portion within the principles of the present exemplary embodiments, to the full extent indicated by the plain meaning of the terms in which the appended claims are expressed.

What is claimed is:

1. A fixing mechanism configured for a server, comprising:
- a housing configured for accommodating an expansion card;
- at least one fixing member slidably arranged on the housing and configured for connecting with the expansion card; and
- at least one sliding member slidably arranged on the housing and slidable along a first direction and an opposite direction of the first direction,
- wherein the first direction is a direction in which the expansion card enters the housing, the sliding member comprises a first supporting portion and a second supporting portion which are interconnected;
- when a portion of the fixing member is connected to the first supporting portion, the fixing member forms a limiting fit with a first limiting portion on the expansion card, thereby locking the expansion card from the housing; and
- when the portion of the fixing member is connected to the second supporting portion, the fixing member is disengaged from the first limiting portion, thereby unlocking the expansion card from the housing.

2. The fixing mechanism of claim 1, further comprising a rotating member configured for driving the sliding member to slide on the housing, wherein one end of the rotating member is rotatably connected to the housing and another end of the rotating member is rotatably connected to the sliding member.

3. The fixing mechanism of claim 2, further comprising a pushing assembly movably connected to the sliding member and the housing, wherein when the sliding member slides along the first direction, the portion of the fixing member switches from being connected to the first supporting portion to being connected to the second supporting portion, and the sliding member is configured for driving the pushing assembly to move.

4. The fixing mechanism of claim 3, wherein the pushing assembly comprises a first connecting rod, a second connecting rod, and a pushing portion, one end of the first connecting rod is hinged to one end of the second connecting rod, another end of the first connecting rod is rotatably connected to the sliding member and is slidable relative to the sliding member along the second direction or the opposite direction of the second direction, the second direction is perpendicular to the first direction;

another end of the second connecting rod is rotatably connected to the pushing portion, and the pushing portion is slidably arranged on the housing and is slidable along the first direction or the opposite direction of the first direction, configured for pushing the expansion card to slide in the opposite direction of the first direction.

5. The fixing mechanism of claim 1, further comprising an elastic reset member connected to the fixing member and the housing, wherein when the portion of the fixing member is connected to the second supporting portion, the elastic reset member is stretched to have elasticity, and the stretched elastic reset member is configured for driving the fixing member to slide in a direction to form a limiting fit with the first limiting portion.

6. The fixing mechanism of claim 1, wherein the fixing member comprises an mounting portion and a second limiting portion, the mounting portion is slidably arranged on the housing, the mounting portion is connected to the first supporting portion or the second supporting portion, the second limiting portion is configured to form the limiting fit with the first limiting portion on the expansion card to lock the expansion card;

the second limiting portion comprises a guiding block that gradually narrows in an opposite direction of a second direction, which is the sliding direction of the fixing member when unlocking the expansion card.

7. The fixing mechanism of claim 1, wherein the housing comprises two opposite inner wall surfaces, each of the two inner wall surfaces is provided with a track member, the track member is arranged along the first direction and configured for sliding installation of the expansion card.

8. The fixing mechanism of claim 1, wherein the housing comprises two opposite first outer walls, and the fixing mechanism comprises two sliding members and two fixing members, the two sliding members are on the two first outer walls respectively, the two sliding members are respectively provided with the two fixing members, the two fixing members are configured to fix expansion cards of different configurations.

9. The fixing mechanism of claim 1, wherein the housing comprises a first connecting portion, the sliding member comprises a second connecting portion, the first connecting portion is movably connected to the second connecting portion, the second connecting portion is slidable relative to the first connecting portion along the first direction or the opposite direction of the first direction.

10. A server, comprising:

a casing and a fixing mechanism arranged on the casing, the fixing mechanism comprising:

a housing configured for accommodating an expansion card;

at least one fixing member slidably arranged on the housing and configured for connecting with the expansion card; and at least one sliding member slidably arranged on the housing and slidable along a first direction and an opposite direction of the first direction, wherein the first direction is a direction in which the expansion card enters the housing, the sliding member comprises a first supporting portion and a second supporting portion which are interconnected;

when a portion of the fixing member is connected to the first supporting portion, the fixing member forms a limiting fit with a first limiting portion on the expansion card, thereby locking the expansion card from the housing; and when the portion of the fixing member is connected to the second supporting portion, the fixing member is disengaged from the first limiting portion, thereby unlocking the expansion card from the housing.

11. The server of claim 10, wherein the fixing mechanism further comprises a rotating member configured for driving the sliding member to slide on the housing, wherein one end of the rotating member is rotatably connected to the housing and another end of the rotating member is rotatably connected to the sliding member.

12. The server of claim 11, wherein the fixing mechanism further comprises a pushing assembly movably connected to the sliding member and the housing, wherein when the sliding member slides along the first direction, the portion of the fixing member switches from being connected to the first supporting portion to being connected to the second supporting portion, and the sliding member is configured for driving the pushing assembly to move.

13. The server of claim 12, wherein the pushing assembly comprises a first connecting rod, a second connecting rod, and a pushing portion, one end of the first connecting rod is hinged to one end of the second connecting rod, another end of the first connecting rod is rotatably connected to the sliding member and is slidable relative to the sliding member along the second direction or the opposite direction of the second direction, the second direction is perpendicular to the first direction;

another end of the second connecting rod is rotatably connected to the pushing portion, and the pushing portion is slidably arranged on the housing and is slidable along the first direction or the opposite direction of the first direction, configured for pushing the expansion card to slide in the opposite direction of the first direction.

14. The server of claim 10, wherein the fixing mechanism further comprises an elastic reset member connected to the fixing member and the housing, wherein when the portion of the fixing member is connected to the second supporting portion, the elastic reset member is stretched to have elasticity, and the stretched elastic reset member is configured for driving the fixing member to slide in a direction to form a limiting fit with the first limiting portion.

15. The server 10, wherein the fixing member comprises a mounting portion and a second limiting portion, the mounting portion is slidably arranged on the housing, the mounting portion is connected to the first supporting portion or the second supporting portion, the second limiting portion is configured to form the limiting fit with the first limiting portion on the expansion card to lock the expansion card;

the second limiting portion comprises a guiding block that gradually narrows in an opposite direction of a second direction, which is the sliding direction of the fixing member when unlocking the expansion card.

16. The server of claim 10, wherein the housing comprises two opposite inner wall surfaces, each of the two inner wall surfaces is provided with a track member, the track member is arranged along the first direction and configured for sliding installation of the expansion card.

17. The server of claim 1, wherein the housing comprises two opposite first outer walls, and the fixing mechanism comprises two sliding members and two fixing members, the two sliding members are on the two first outer walls respectively, the two sliding members are respectively provided with the two fixing members, the two fixing members are configured to fix expansion cards of different configurations.

18. The server of claim 1, wherein the housing comprises a first connecting portion, the sliding member comprises a second connecting portion, the first connecting portion is movably connected to the second connecting portion, the second connecting portion is slidable relative to the first connecting portion along the first direction or the opposite direction of the first direction.

* * * * *